United States Patent
Watanabe

(10) Patent No.: US 11,963,313 B2
(45) Date of Patent: Apr. 16, 2024

(54) DISPLAY APPARATUS

(71) Applicant: SATURN LICENSING LLC, New York, NY (US)

(72) Inventor: Masayasu Watanabe, Tokyo (JP)

(73) Assignee: SATURN LICENSING LLC, New York, NY (US)

( * ) Notice: Subject to any disclaimer, the term of this patent is extended or adjusted under 35 U.S.C. 154(b) by 0 days.

(21) Appl. No.: 18/140,037

(22) Filed: Apr. 27, 2023

(65) Prior Publication Data

US 2023/0389194 A1     Nov. 30, 2023

Related U.S. Application Data

(63) Continuation of application No. 17/414,695, filed as application No. PCT/JP2019/048750 on Dec. 12, 2019, now Pat. No. 11,683,893.

(30) Foreign Application Priority Data

Dec. 27, 2018   (JP) ................................ 2018-244839

(51) Int. Cl.
    *H05K 5/00*      (2006.01)
(52) U.S. Cl.
    CPC .................................. *H05K 5/0017* (2013.01)
(58) Field of Classification Search
    None
    See application file for complete search history.

(56) References Cited

U.S. PATENT DOCUMENTS

| 9,491,874 | B2 * | 11/2016 | Hirasawa | G02B 27/28 |
| 9,739,923 | B2 * | 8/2017 | Momose | G02B 6/0016 |
| 9,888,588 | B2 * | 2/2018 | Esterbauer | H05K 5/0017 |

(Continued)

FOREIGN PATENT DOCUMENTS

| JP | H10153764 | 6/1998 |
| JP | 2004086046 | 3/2004 |

(Continued)

OTHER PUBLICATIONS

International Search Report for PCT/JP2019/048750 dated Feb. 18, 2020; 4 pages—* cited in parent app.

*Primary Examiner* — Xanthia C Relford
(74) *Attorney, Agent, or Firm* — Richard LaPeruta

(57) ABSTRACT

Provided is a display apparatus having a simple structure suitable for an increase in screen size and a decrease in thickness. The display apparatus includes a display panel, a substrate, and a frame structure. The substrate has an outer circumference end face including a first end face part and a second end face part intersecting the first end face part at a first intersection, a first groove formed on the first end face part and extending in a first direction, and a second groove formed on the second end face part and extending in a second direction. The frame structure holds the display panel and the substrate, and has a cyclic frame part surrounding the substrate and the display panel, a first rib erected on a first part, of the frame part, that is other than a first corner part corresponding to the first intersection and fitted with the first groove, and a second rib erected on a second part, of the frame part, that is other than the first corner part corresponding to the first intersection and fitted with the second groove.

20 Claims, 14 Drawing Sheets

(56) References Cited

U.S. PATENT DOCUMENTS

| | | | |
|---|---|---|---|
| 10,012,377 B2* | 7/2018 | Coo | F21V 7/0066 |
| 10,371,972 B2* | 8/2019 | Shin | G02F 1/133308 |
| 10,437,102 B2* | 10/2019 | Katagiri | G02F 1/133317 |
| 10,563,826 B2* | 2/2020 | Lee | F21V 3/02 |
| 11,016,242 B2* | 5/2021 | Woo | G02B 6/0055 |
| 11,330,727 B2* | 5/2022 | Fang | G09F 9/00 |
| 2009/0072678 A1* | 3/2009 | Yokawa | H04N 5/645 |
| | | | 312/7.2 |
| 2009/0115919 A1* | 5/2009 | Tanaka | H05K 7/20972 |
| | | | 348/836 |
| 2012/0106048 A1* | 5/2012 | Byeon | G02F 1/133308 |
| | | | 361/679.01 |
| 2012/0146883 A1* | 6/2012 | Choi | G09F 9/35 |
| | | | 345/1.1 |
| 2012/0162880 A1* | 6/2012 | Yoon | H04N 5/64 |
| | | | 361/679.01 |
| 2014/0176854 A1* | 6/2014 | Shin | G02F 1/133308 |
| | | | 445/24 |
| 2015/0015793 A1* | 1/2015 | Noguchi | H05K 5/0004 |
| | | | 348/725 |
| 2015/0208523 A1* | 7/2015 | Lee | G06F 1/1601 |
| | | | 361/679.01 |
| 2015/0338985 A1 | 11/2015 | Sun et al. | |
| 2017/0227808 A1* | 8/2017 | Lee | G02F 1/133308 |

FOREIGN PATENT DOCUMENTS

| | | |
|---|---|---|
| JP | 2006004215 | 1/2006 |
| JP | 2010015098 | 1/2010 |
| JP | 2010211054 | 9/2010 |
| JP | 2012141385 | 7/2012 |
| JP | 2013064990 | 4/2013 |
| KR | 20070056375 | 6/2007 |
| KR | 20100025173 | 3/2010 |

* cited by examiner

[ FIG. 1 ]
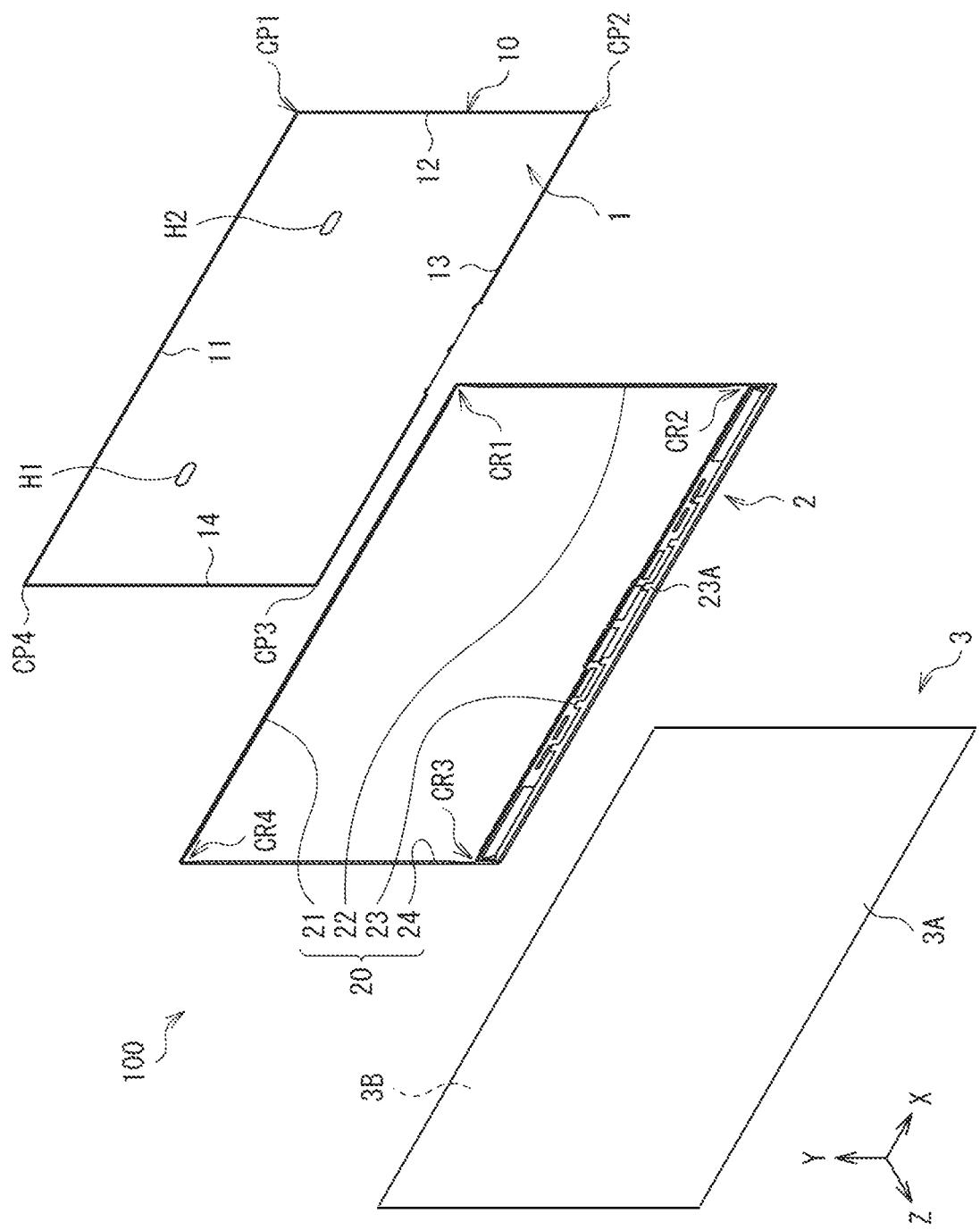

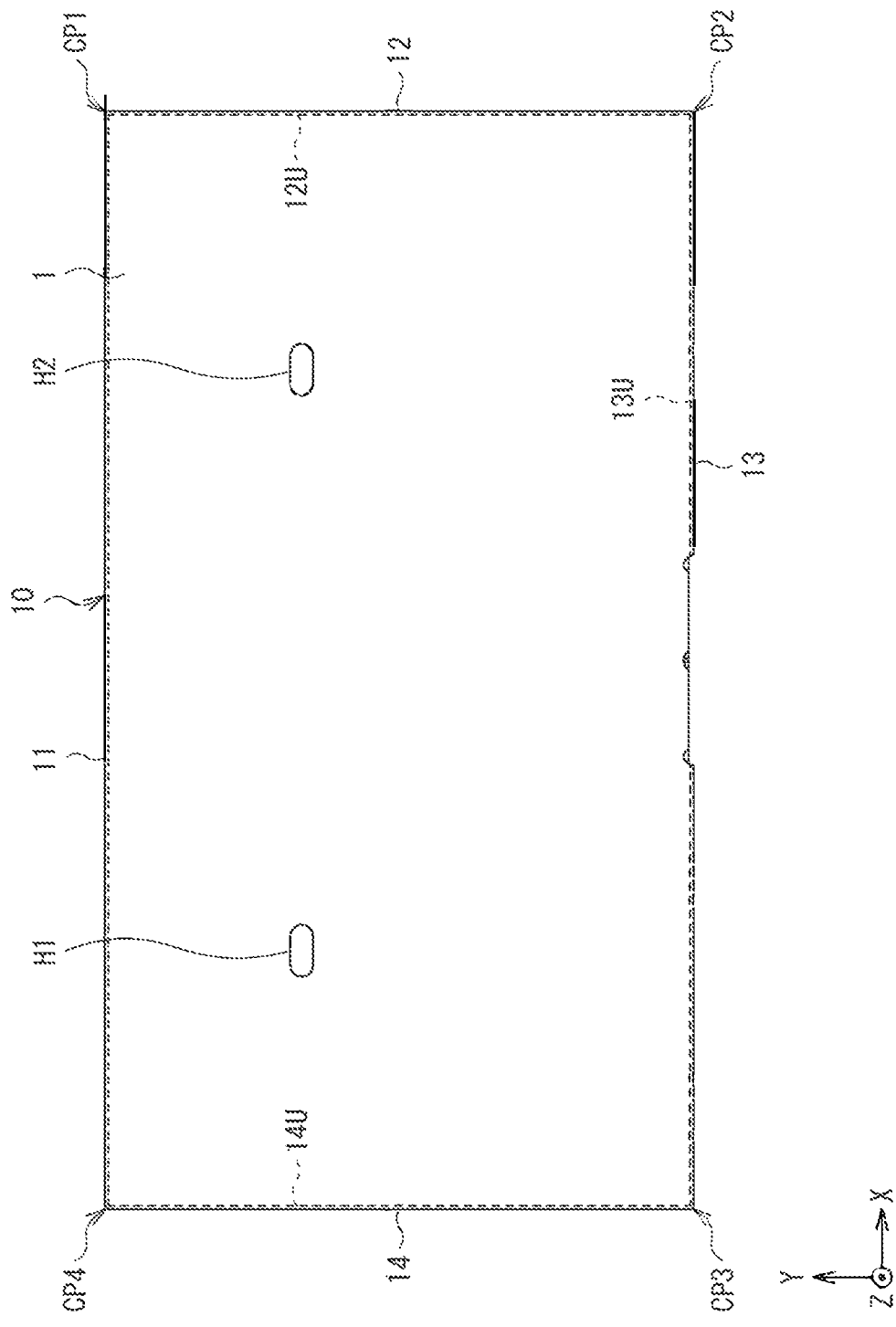
[FIG. 2]

[ FIG. 3 ]
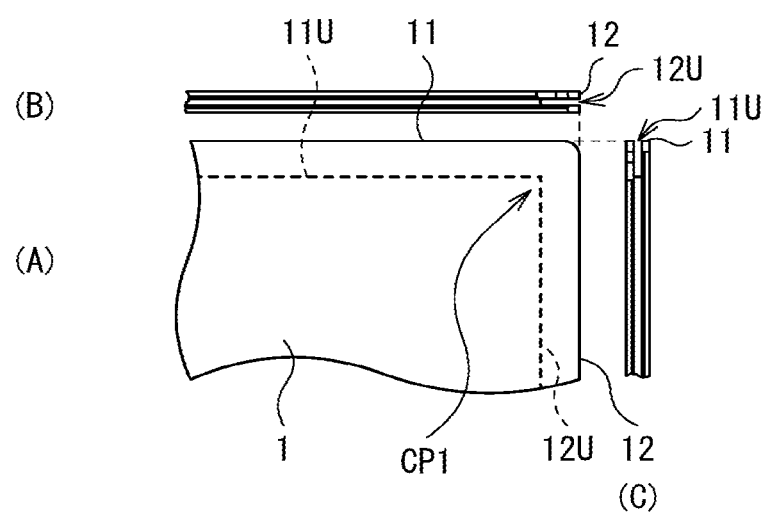

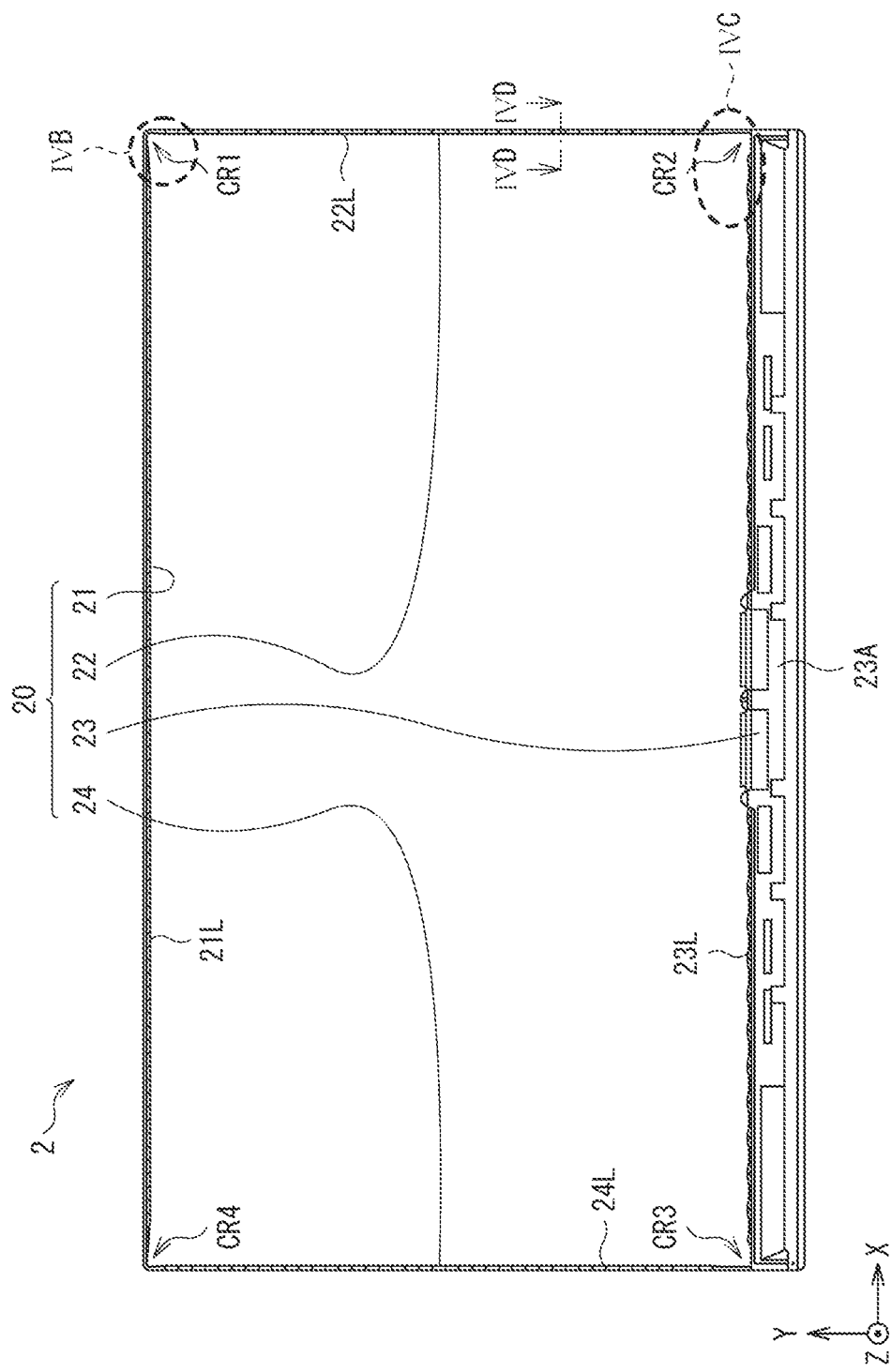
[FIG. 4A]

[ FIG. 4B ]
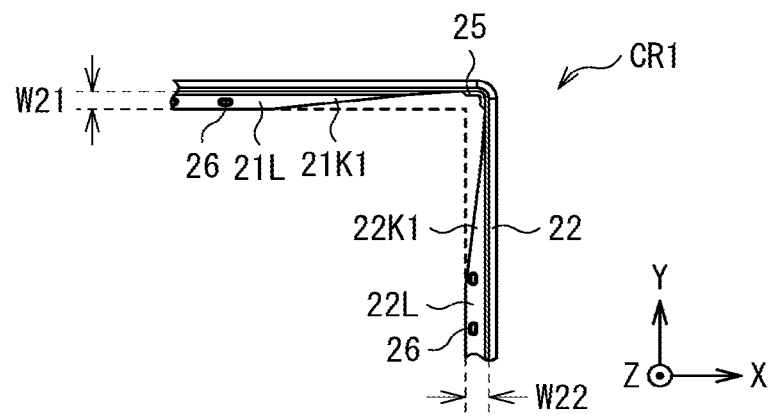
[ FIG. 4C ]
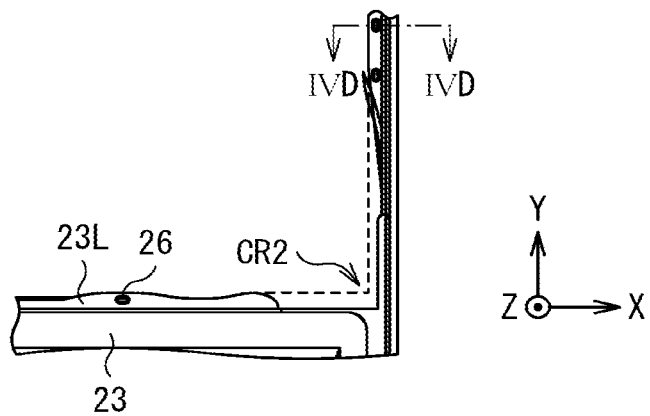
[ FIG. 4D ]
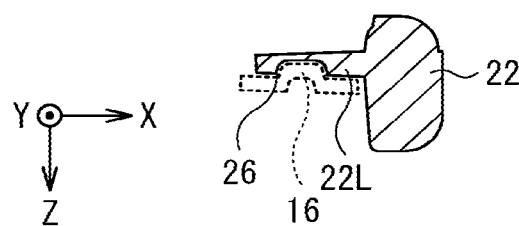

[ FIG. 4E ]
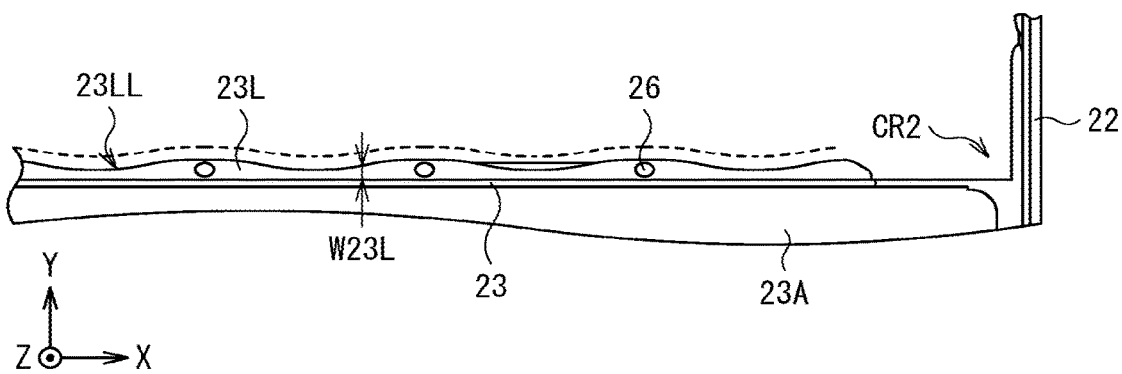

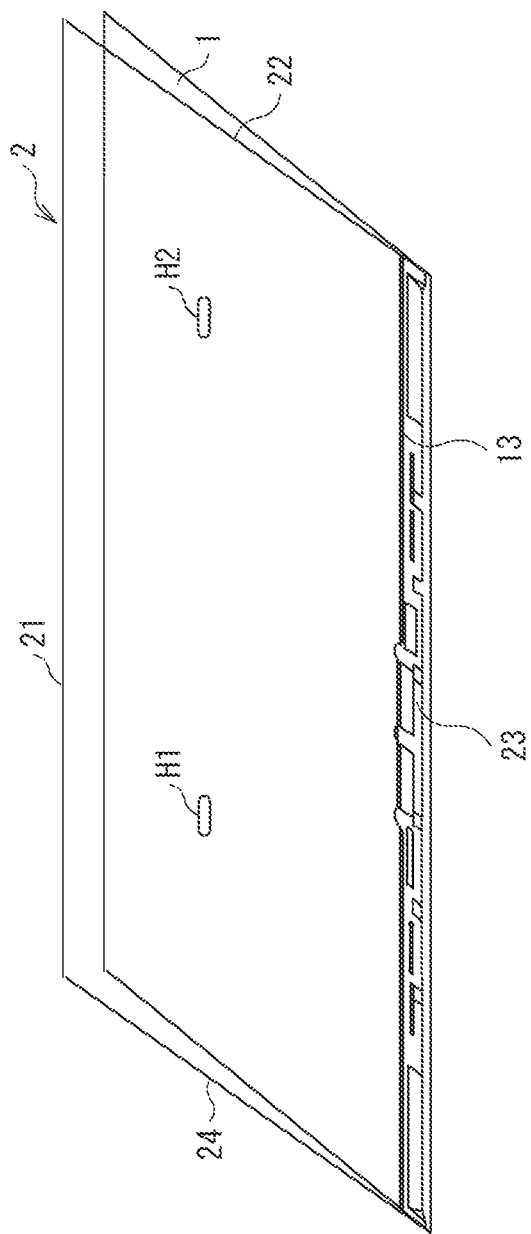

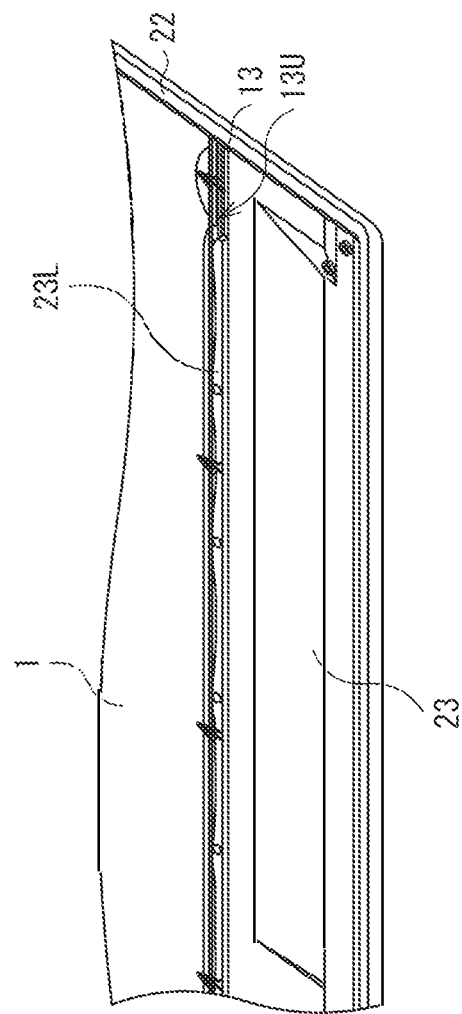
[ FIG. 5B ]

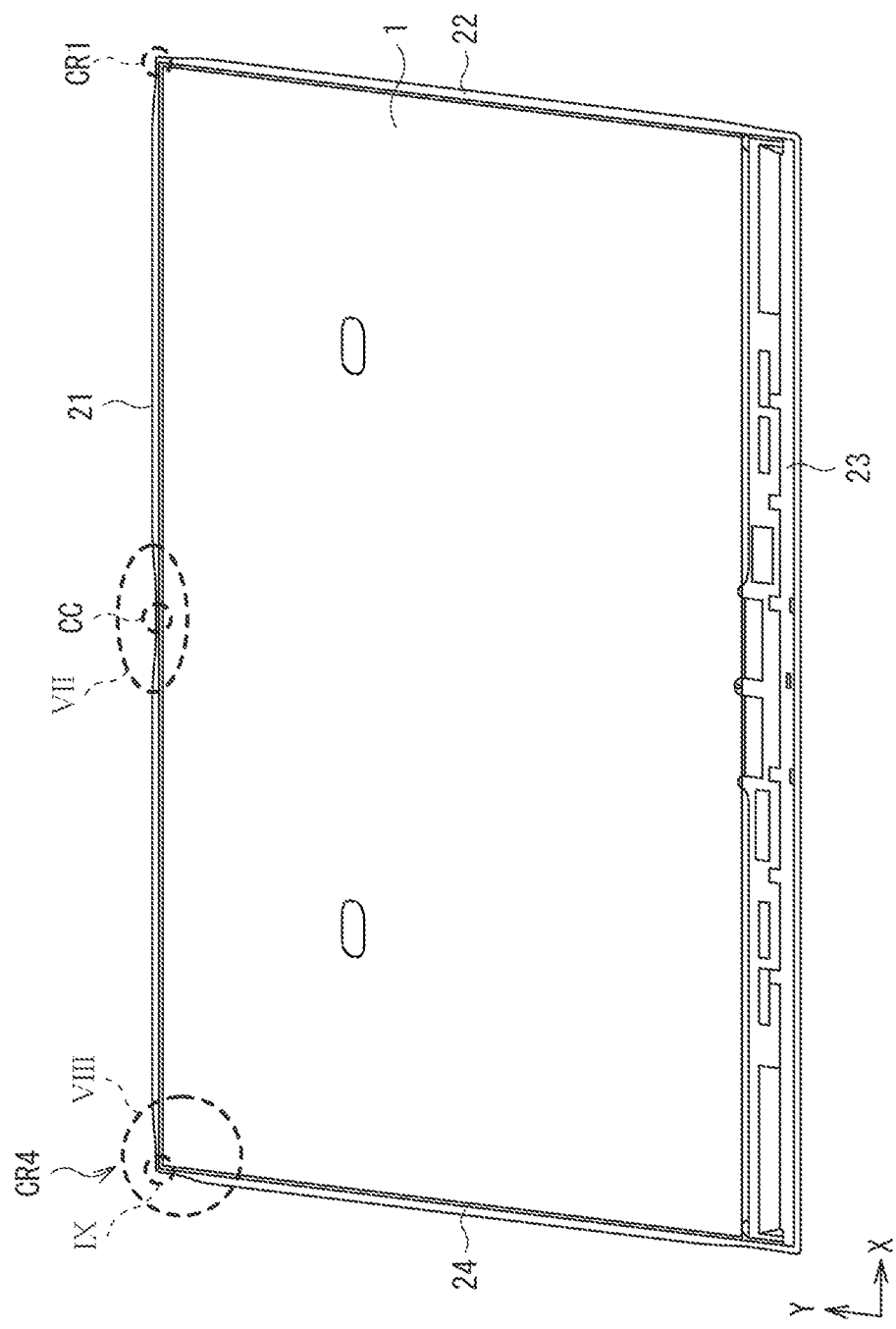
[FIG. 6]

[ FIG. 7 ]
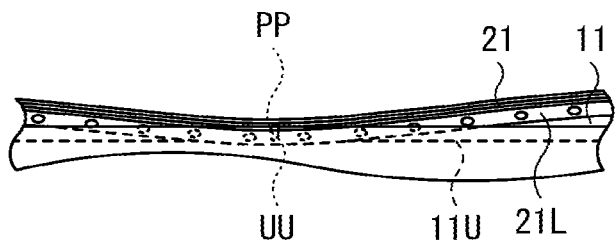
[ FIG. 8 ]
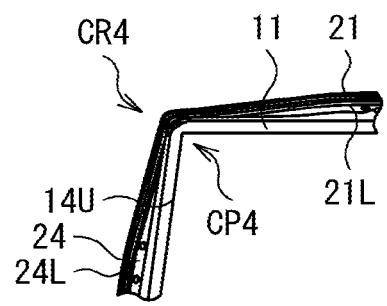
[ FIG. 9A ]
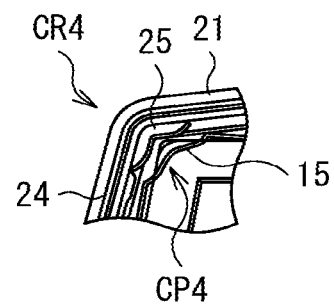
[ FIG. 9B ]
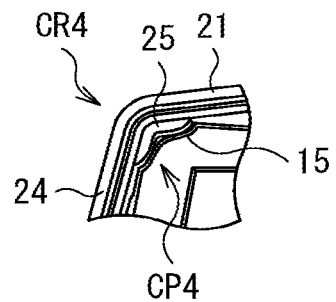

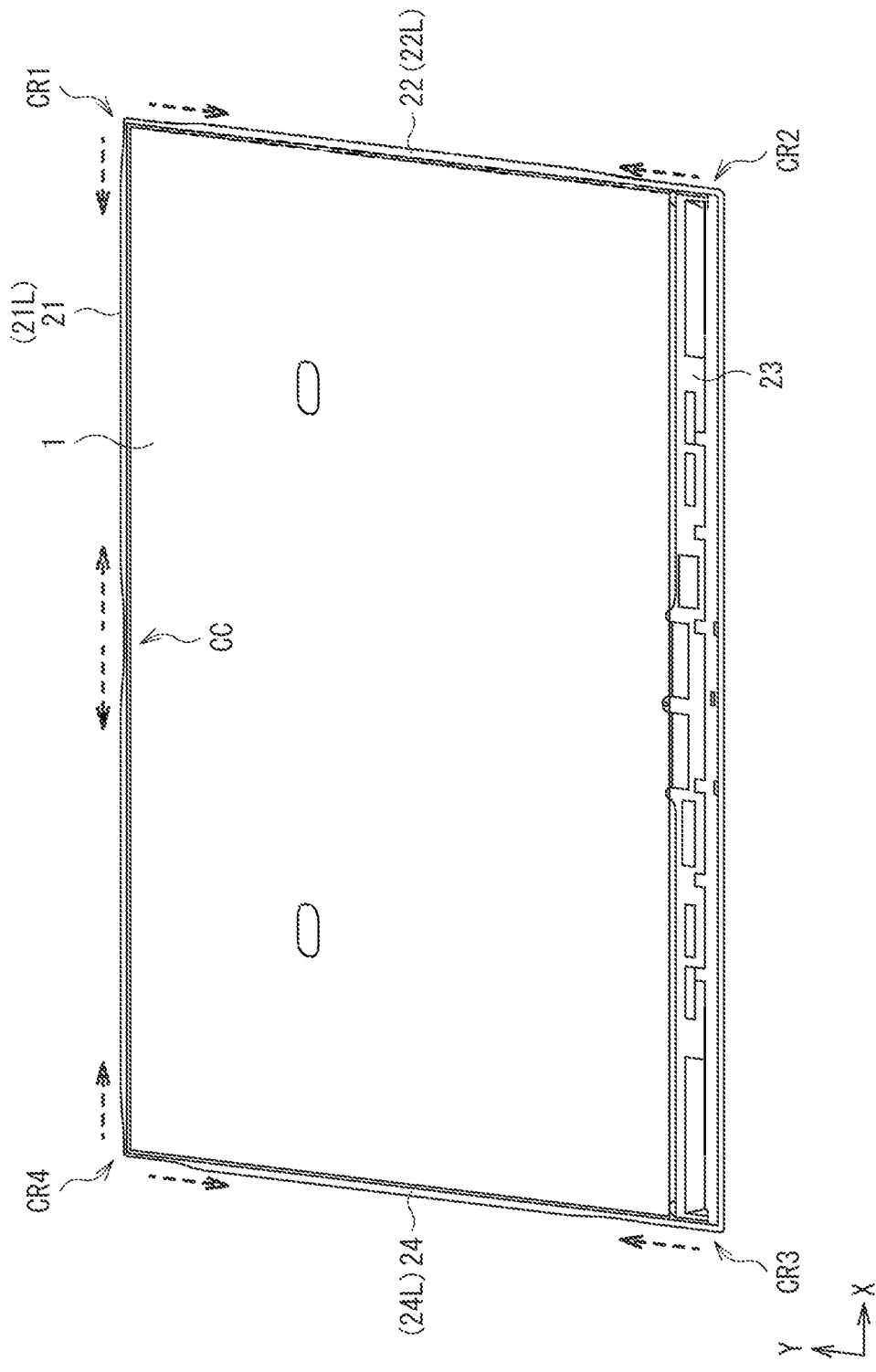
[ FIG. 10 ]

[ FIG. 11A ]
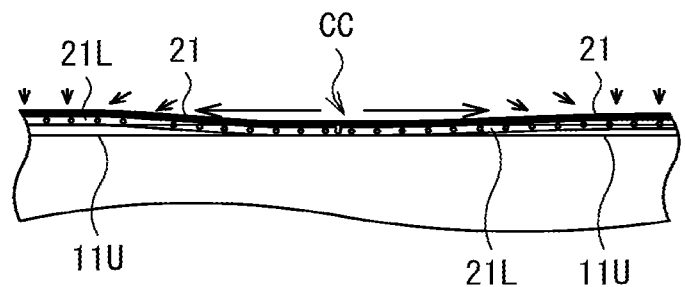
[ FIG. 11B ]
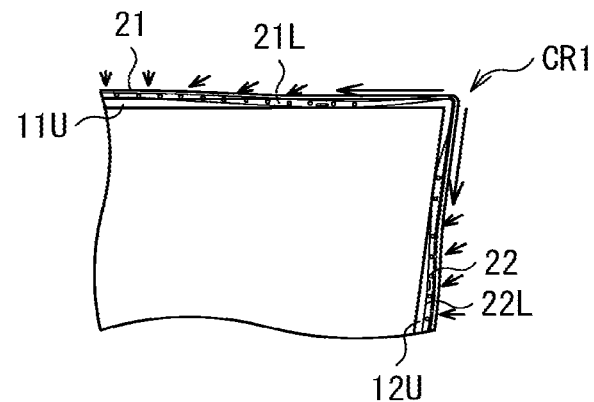
[ FIG. 11C ]
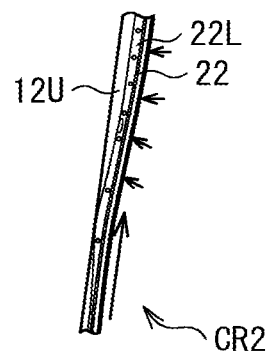

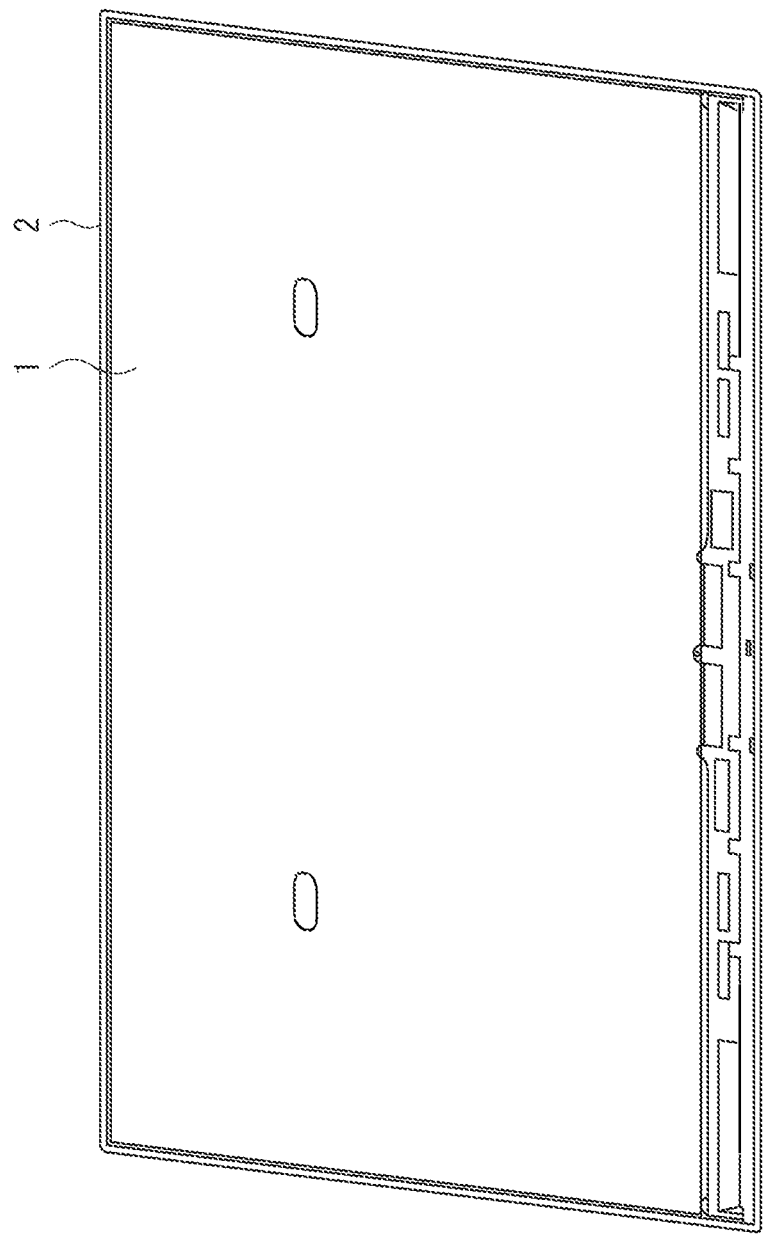
[ FIG. 12 ]

[ FIG. 13 ]
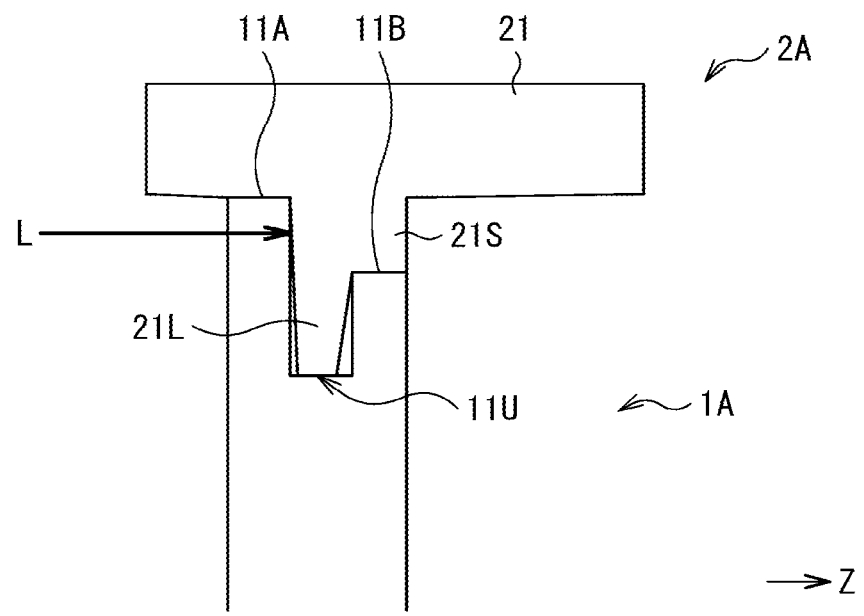
[ FIG. 14 ]
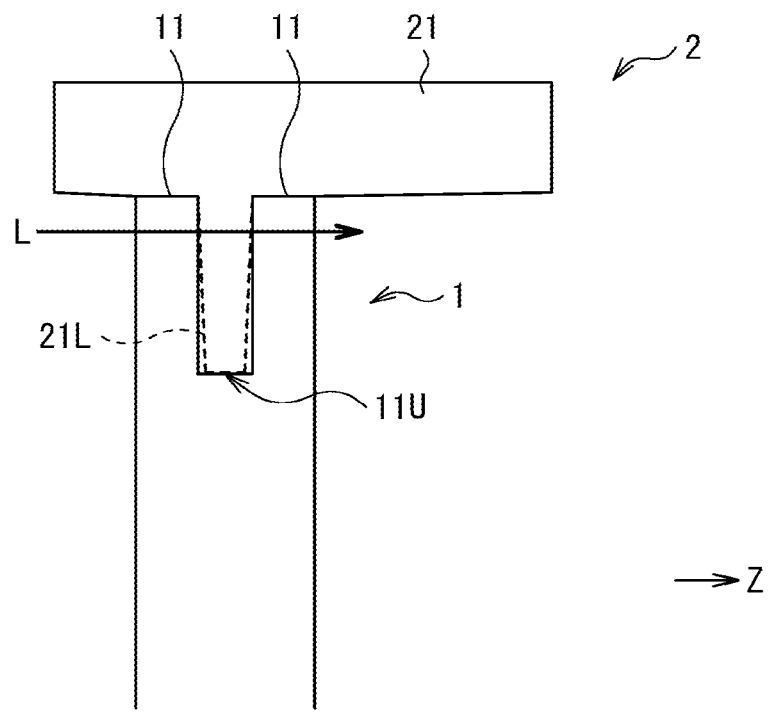

DISPLAY APPARATUS

CROSS-REFERENCE TO RELATED APPLICATIONS

This application is a continuation of U.S. patent application Ser. No. 17/414,695 filed Dec. 12, 2019, which is a National Stage Application under 35 U.S.C. § 371 of International Application No. PCT/JP2019/048750 filed Dec. 12, 2019, which claims the priority from Japanese Patent Application No. 2018-244839 filed in the Japanese Patent Office on Dec. 27, 2018, the entire contents of which are hereby incorporated by reference.

TECHNICAL FIELD

The present disclosure relates to a display apparatus.

BACKGROUND ART

In recent years, a display apparatus which is thin but having a large screen size has been proposed (see, for example, Patent Literatures 1 to 3).

CITATION LIST

Patent Literature

Patent Literature 1: Japanese Unexamined Patent Application Publication No. 2004-86046
Patent Literature 2: Japanese Unexamined Patent Application Publication No. 2010-15098
Patent Literature 3: Japanese Unexamined Patent Application Publication No. 2012-141385

SUMMARY OF THE INVENTION

Recently, with an increase in screen size and a decrease in thickness of a display apparatus, a simplification of a frame structure has been demanded.

Therefore, it is desirable to provide a display apparatus having a simple structure suitable for an increase in screen size and a decrease in thickness.

A display apparatus according to one embodiment of the present disclosure includes a display panel, a substrate, and a frame structure. The display panel has a display surface and a rear surface. The substrate faces the rear surface of the display panel, and has an outer circumference end face, a first groove, and a second groove, in which the outer circumference end face includes a first end face part extending in a first direction and a second end face part extending in a second direction and intersecting the first end face part at a first intersection, the first groove is formed on the first end face part and extends in the first direction, and the second groove is formed on the second end face part and extends in the second direction. The frame structure holds the display panel and the substrate, and has a frame part, a first rib, and a second rib, in which the frame part has a cyclic shape, extends along the outer circumference end face, and surrounds the substrate and the display panel, the first rib is erected on a first part, of the frame part, that is other than a first corner part corresponding to the first intersection and is fitted with the first groove, and the second rib is erected on a second part, of the frame part, that is other than the first corner part corresponding to the first intersection and is fitted with the second groove.

BRIEF DESCRIPTION OF THE DRAWINGS

FIG. 1 is an exploded perspective diagram illustrating an example of an overall configuration of a display apparatus according to an embodiment of the present disclosure.

FIG. 2 is a plan diagram illustrating an example of a configuration of a supporting substrate illustrated in FIG. 1.

FIG. 3 is a plan diagram and a side diagram illustrating, in an enlarged fashion, the vicinity of a first intersection of the supporting substrate illustrated in FIG. 1.

FIG. 4A is a plan diagram illustrating an example of a configuration of a frame structure illustrated in FIG. 1.

FIG. 4B is a partial plan diagram illustrating, in an enlarged fashion, the vicinity of a first corner part of the frame structure illustrated in FIG. 4A.

FIG. 4C is a partial plan diagram illustrating, in an enlarged fashion, the vicinity of a second corner part of the frame structure illustrated in FIG. 4A.

FIG. 4D is an enlarged cross-sectional diagram illustrating, in an enlarged fashion, a cross section of a second part of the frame structure illustrated in FIG. 4A.

FIG. 4E is a partial plan diagram illustrating, in an enlarged fashion, a third part of the frame structure illustrated in FIG. 4A.

FIG. 5A is a first explanatory diagram for explaining an assembling method of the display apparatus illustrated in FIG. 1.

FIG. 5B is a second explanatory diagram for explaining the assembling method of the display apparatus illustrated in FIG. 1.

FIG. 6 is a third explanatory diagram for explaining the assembling method of the display apparatus illustrated in FIG. 1.

FIG. 7 is an enlarged perspective diagram illustrating, in an enlarged fashion, the vicinity of a center position of a frame part illustrated in FIG. 6.

FIG. 8 is an enlarged perspective diagram illustrating, in an enlarged fashion, the vicinity of a fourth corner part of the frame part illustrated in FIG. 6.

FIG. 9A is an enlarged perspective diagram illustrating, in a further enlarged fashion, the vicinity of the fourth corner part of the frame part illustrated in FIG. 6.

FIG. 9B is an enlarged perspective diagram illustrating, in a further enlarged fashion, the vicinity of the fourth corner part of the frame part illustrated in FIG. 6.

FIG. 10 is a fourth explanatory diagram for explaining the assembling method of the display apparatus illustrated in FIG. 1.

FIG. 11A is an enlarged perspective diagram illustrating, in an enlarged fashion, the vicinity of the center position of the frame part illustrated in FIG. 10.

FIG. 11B is an enlarged perspective diagram illustrating, in an enlarged fashion, the vicinity of the first corner part of the frame part illustrated in FIG. 10.

FIG. 11C is an enlarged perspective diagram illustrating, in an enlarged fashion, the vicinity of the second corner part of the frame part illustrated in FIG. 10.

FIG. 12 is a fifth explanatory diagram for explaining the assembling method of the display apparatus illustrated in FIG. 1.

FIG. 13 is a cross-sectional diagram illustrating an example of a cross-sectional configuration taken along a thickness direction of the supporting substrate and the frame structure according to a first modification example.

FIG. 14 is a cross-sectional diagram illustrating an example of a cross-sectional configuration taken along the thickness direction of the supporting substrate and the frame structure illustrated in FIG. 1.

MODES FOR CARRYING OUT THE INVENTION

Hereinafter, some embodiments of the present disclosure are described in detail with reference to the drawings. The description will be made in the following order.

1. One Embodiment and Modification Examples Thereof

An example of a display apparatus having a structure that integrally holds a display panel and a supporting substrate by a cyclic frame structure.

2. Other Modification Examples

1. One Embodiment

[Configuration of Display Apparatus 100]

FIG. 1 is an exploded perspective diagram illustrating an example of an overall configuration of a display apparatus 100 according to an embodiment of the present disclosure. As illustrated in FIG. 1, the display apparatus 100 is used, for example, as a thin television apparatus, and includes a supporting substrate 1, a frame structure 2, and a display panel 3.

(Display Panel 3)

The display panel 3 is a display device having a display surface 3A that displays an image such as a moving image or a still image toward the front (+Z direction), and a rear surface 3B facing to the rear (−Z direction) on the opposite side of the display surface 3A. The display panel 3 has, for example, a display element layer including a plurality of pixels that use display elements such as self-emitting elements, such as organic EL (Electro Luminescence) elements, or liquid crystal elements. The display panel 3 has a rectangular planar shape including an outer edge extending in each of a horizontal direction (an X-axis direction) and a vertical direction (a Y-axis direction).

Note that the horizontal direction (the X-axis direction) corresponds to one specific example of a "first direction" of the present disclosure, and the vertical direction (the Y-axis direction) corresponds to one specific example of a "second direction" of the present disclosure.

(Supporting Substrate 1)

As illustrated in FIG. 1, the supporting substrate 1 is a structural member that is disposed so as to face the rear surface 3B of the display panel 3 and mechanically supports the display apparatus 100 as a whole together with the frame structure 2. The supporting substrate 1 has a size and a shape corresponding to the display panel 3 in an X-Y plane that is parallel to the display surface 3A and the rear surface 3B. That is, the supporting substrate 1 is a thin plate-like member defined by an outer circumference end face 10 that includes first to fourth end face parts 11 to 14 in the X-Y plane and having a rectangular planar shape including first to fourth intersections CP1 to CP4. The supporting substrate 1 includes a metal material having a high strength and excellent workability, such as stainless steel or an aluminum alloy. Note that a peripheral part of a surface of the supporting substrate 1 facing the rear surface 3B of the display panel 3 may be painted with a black paint or the like in order to prevent light from being reflected from the display panel 3 side.

FIG. 2 is a plan diagram illustrating an example of an overall configuration of the supporting substrate 1 illustrated in FIG. 1. The first end face part 11 and the third end face part 13 extend, for example, in the X-axis direction, and the second end face part 12 and the fourth end face part 14 extend, for example, in the Y-axis direction. The first end face part 11 and the second end face part 12 intersect at the first intersection CP1, the second end face part 12 and the third end face part 13 intersect at the second intersection CP2, the third end face part 13 and the fourth end face part 14 intersect at the third intersection CP3, and the fourth end face part 14 and the first end face part 11 intersect at the fourth intersection CP4.

The supporting substrate 1 has first to fourth grooves 11U to 14U that are continuous along the outer circumference end face 10. Specifically, the first groove 11U is formed on the first end face part 11 and extends in the X-axis direction, the second groove 12U is formed on the second end face part 12 and extends in the Y-axis direction, the third groove 13U is formed on the third end face part 13 and extends in the X-axis direction, and the fourth groove 14U is formed on the fourth end face part 14 and extends in the Y-axis direction.

FIG. 3 is a plan diagram and a side diagram illustrating, in an enlarged fashion, the vicinity of the first intersection CP1 of the supporting substrate 1. (A) of FIG. 3 is a plan diagram illustrating, in an enlarged fashion, the vicinity of the first intersection CP1 of the supporting substrate 1. (B) of FIG. 3 is a side diagram illustrating the supporting substrate 1 along the first end face part 11 in the vicinity of the first intersection CP1, and (C) of FIG. 3 is a side diagram illustrating the supporting substrate 1 along the second end face part 12 in the vicinity of the first intersection CP1. As illustrated in FIG. 3, in the vicinity of the first intersection CP1, a first groove 11U recessed inward from the first end face part 11 at an intermediate part in a thickness direction (a Z-axis direction) of the supporting substrate 1 and a second groove 12U recessed inward from the second end face part 12 at an intermediate part in the thickness direction (the Z-axis direction) of the supporting substrate 1 intersect with each other. Note that a thickness of the supporting substrate 1 is, for example, about 3.5 mm, a width of each of the first to the fourth grooves 11U to 14U (a size in the Z-axis direction) is about 1 mm, and a depth of each of the first to the fourth grooves 11U to 14U (a length of recession from each of the first to the fourth end face parts 11 to 14) is about 5.5 mm.

The supporting substrate 1 may have, for example, two openings H1 and H2 penetrating in the thickness direction (the Z-axis direction). A vibration device is attached to each of the openings H1 and H2 of the supporting substrate 1. In the display apparatus 100, a sound is outputted by vibrating the supporting substrate 1 by means of the vibration devices.

(Frame Structure 2)

As illustrated in FIG. 1, the frame structure 2 has the cyclic frame part 20 extending along the outer circumference end face 10 of the supporting substrate 1 and surrounding both the supporting substrate 1 and the display panel 3. FIG. 4A is a plan diagram illustrating an example of an overall configuration of the frame structure 2 illustrated in FIG. 1. As illustrated in FIGS. 1 and 4A, the frame part 20 has first to fourth corner parts CR1 to CR4 corresponding respectively to the first intersections CP1 to CP4 of the supporting substrate 1, and first to fourth straight parts 21 to 24 that respectively face the first to the fourth end face parts 11 to 14 of the outer circumference end face 10 of the supporting substrate 1.

FIG. 4B is a partial plan diagram illustrating, in an enlarged fashion, the vicinity of the first corner part CR1 of the frame structure 2, that is, a region IVB surrounded by a broken line in FIG. 4A. FIG. 4C is a partial plan diagram illustrating, in an enlarged fashion, the vicinity of the second corner part CR1 of the frame structure 2, that is, a region IVC surrounded by a broken line in FIG. 4A. FIG. 4D is an enlarged cross-sectional diagram illustrating, in an enlarged fashion, a cross section of the second straight part 22 of the frame structure 2, and illustrates a cross section taken along the IVD-IVD cutting line illustrated in FIG. 4A and as viewed in an arrow direction. Further, FIG. 4E is a partial plan diagram illustrating, in an enlarged fashion, a part of the third straight part 23 of the frame structure 2.

The first straight part 21 is located between the first corner part CR1 and the fourth corner part CR4. A first rib 21L that fits with the first groove 11U is erected on the first straight part 21.

The second straight part 22 is located between the first corner part CR1 and the second corner part CR2. A second rib 22L that fits with the second groove 12U is erected on the second straight part 22.

The third straight part 23 is located between the second corner part CR2 and the third corner part CR3. A third rib 23L that fits with the third groove 13U is erected on the third straight part 23.

The fourth straight part 24 is located between the third corner part CR3 and the fourth corner part CR4. A fourth rib 24L that fits with the fourth groove 14U is erected on the fourth straight part 24.

Each of the first to the fourth ribs 21L to 24L is erected toward an inner region surrounded by the frame part 20, that is, in a depth direction of each of the first to the fourth grooves 11U to 14U.

As illustrated in FIG. 4B, the first corner part CR1 is not provided with any of the first rib 21L and the second rib 22L, and instead is provided with a light shielding part 25. The light shielding part 25 is a member that blocks light entering from the rear surface of the display apparatus 100 through a gap between the supporting substrate 1 and the frame structure 2 at the first corner part CR1. The first rib 21L includes an inclined part 21K1 in which a width W21 becomes narrower as going more toward the first corner part CR1. The second rib 22L includes an inclined part 22K1 in which a width W22 becomes narrower as going more toward the first corner part CR1. The width of the first rib 21L here is a size in a direction parallel to the XY plane and orthogonal to the first end face part 11, i.e., a size in the Y-axis direction, and the width of the second rib 22L is a size in a direction parallel to the XY plane and orthogonal to the second end face part 12, i.e., a size in the X-axis direction.

Note that, although not illustrated, a configuration in the vicinity of the fourth corner part CR4 is substantially the same as the configuration in the vicinity of the first corner part CR1 illustrated in FIG. 4B. That is, the fourth corner part CR4 is not provided with any of the fourth rib 24L and the first rib 21L, and instead is provided with the light shielding part 25. The first rib 21L includes an inclined part in which a width becomes narrower as going more toward the fourth corner part CR4. The fourth rib 24L includes an inclined part in which a width becomes narrower as going more toward the fourth corner part CR4. The width of the fourth rib 24L here is a size in a direction parallel to the XY plane and orthogonal to the fourth end face part 14, i.e., a size in the X-axis direction.

As illustrated in FIG. 4C, neither the second rib 22L nor the third rib 23L is provided at the second corner part CR2. Although not described in FIG. 4C or the like, the light shielding part 25 may also be provided at the second corner part CR2.

Note that, although not illustrated, a configuration in the vicinity of the third corner part CR3 is substantially the same as the configuration in the vicinity of the second corner part CR2 illustrated in FIG. 4C. That is, neither the third rib 23L nor the fourth rib 24L is provided at the third corner part CR3. Note that the light shielding part 25 may also be provided at the third corner part CR3.

In addition, as illustrated in FIG. 4E, the third rib 23L has a concavo-convex shape in which a width W23L varies cyclically in the X-axis direction. The width W23L is a size of the third rib 23L in a direction parallel to the display surface 3A and orthogonal to the third end face part 13, i.e., in the Y-axis direction. The third rib 23L having such an edge 23LL having the concavo-convex shape facilitates insertion of the third rib 23L into the third groove 13U in a stepwise manner in the X-axis direction.

Further, in the first to the fourth ribs 21L to 24L, surfaces facing the display panel 3 are provided with a plurality of depressed parts 26 discretely in extending directions of the respective first to fourth ribs 21L to 24L, as illustrated in FIGS. 4B to 4E. The depressed part 26 is a so-called caulking hole, and, for example, as illustrated in FIG. 4D, a part 16 of the supporting substrate 1 which overlaps in a thickness direction (the Z-axis direction) is deformed into a shape along the depressed part 26, allowing the supporting substrate 1 to be firmly held by the frame structure 2.

Note that the third straight part 23 is provided with a circuit substrate mounting section 23A. For example, a substrate including a power supply circuit and a substrate including an image processing circuit and the like are placed at the circuit substrate mounting section 23A.

[Assembling Method of Display Apparatus 100]

Next, referring to FIGS. 5A to 12, an assembling method of the display apparatus 100 will be described.

First, as illustrated in FIG. 5A, the third end face part 13 of the supporting substrate 1 and the third straight part 23 of the frame structure 2 are brought into contact with each other. At this time, as illustrated in an enlarged perspective diagram of FIG. 5B, the third rib 23L in the third straight part 23 of the frame structure 2 is inserted into the third groove 13U in the third end face part 13 of the supporting substrate 1. As a result, the third groove 13U and the third rib 23L are fitted to each other.

Next, as illustrated in FIG. 6, a center position CC in the X-axis direction in the first straight part 21 of the frame part 20 is aligned with a center position in the X-axis direction in the first end face part 11 of the supporting substrate 1. At this time, as illustrated in FIG. 7, a protrusion PP provided at the center position CC in the X-axis direction in the first straight part 21 is engaged with a cutout UU provided at the center position in the X-axis direction in the first end face part 11. At this time, only a portion of the first rib 21L in the vicinity of the protrusion PP is inserted into the first groove 11U. Note that FIG. 7 is an enlarged perspective diagram illustrating, in an enlarged fashion, a region VII surrounded by a broken line in FIG. 6.

Thereafter, as illustrated in FIG. 6, the first corner part CR1 is hooked to the first intersection CP1 and the fourth corner part CR4 is hooked to the fourth intersection CP4. FIG. 8 is an enlarged view of a region VIII surrounded by a broken line in FIG. 6. At this time, as illustrated in FIGS. 9A and 9B, the light shielding part 25 of the fourth corner part CR4 is engaged with, for example, a cutout 15 provided at the fourth intersection CP4 of the supporting substrate 1.

FIGS. 9A and 9B are each a further enlarged perspective diagram illustrating, in an enlarged fashion, a region IX surrounded by a broken line in FIG. 6.

Subsequently, as illustrated in FIG. 10, the first rib 21L erected on the first straight part 21, the second rib 22L erected on the second straight part 22, and the fourth rib 24L erected on the fourth straight part 24 are sequentially inserted into the first groove 11U, the second groove 12U, and the fourth groove 14U along the directions indicated by respective broken line arrows. Specifically, the first rib 21L erected on the first straight part 21 is sequentially inserted toward each of the first corner part CR1 and the fourth corner part CR4, with the center position CC serving as a starting point, and is sequentially inserted toward the center position CC respectively, with the first corner part CR1 and the fourth corner part CR4 each serving as a starting point. In addition, the second rib 22L erected on the second straight part 22 is sequentially inserted toward the second corner part CR2, with the first corner part CR1 serving as a starting point, and is sequentially inserted toward the first corner part CR1, with the second corner part CR2 serving as a starting point. Further, the fourth rib 24L erected on the fourth straight part 24 is sequentially inserted toward the fourth corner part CR4, with the third corner part CR3 serving as a starting point, and is sequentially inserted toward the third corner part CR3, with the fourth corner part CR4 serving as a starting point. FIG. 11A illustrates the vicinity of the center position CC in an enlarged fashion. FIG. 11B illustrates the vicinity of the first corner part CR1 in an enlarged fashion. Further, FIG. 11C illustrates the vicinity of the first corner part CR1 in an enlarged fashion.

After all the portions of the first to the fourth ribs 21L to 24L are inserted into the respective first to fourth grooves 11U to 14U, a peripheral part of the supporting substrate 1 is deformed so as to fit with the depressed parts 26 provided on each of the first to the fourth ribs 21L to 24L to thereby form the part 16. This completes the attachment of the frame structure 2 to the supporting substrate 1 as illustrated in FIG. 12. Thereafter, a peripheral circuit such as a power supply circuit or an image processing circuit, and the display panel 3 are placed on the frame structure 2 to complete the display apparatus 100.

[Workings and Effects of Display Apparatus 100]

The display apparatus 100 of the present embodiment has the frame structure 2 in which the cyclic frame part 20 is included and integrated. Hence, it is possible to improve the aesthetics and to hold the supporting substrate 1 and the display panel 3 mechanically stably as compared with a form in which a frame structure is divided into a plurality of frame structures.

That is, according to the display apparatus 100, because the frame structure 2 having the cyclic frame part 20 is employed, it is possible to prevent a deformation due to self-weight or the like resulting from an increase in screen size and a decrease in thickness, while having a simple configuration. Accordingly, it is possible to achieve a structure suitable for increasing the screen size and decreasing the thickness while securing an appropriate strength.

In addition, in the display apparatus 100, the frame part 20 has the first to the fourth ribs 21L to 24L at portions other than the first to the fourth corner parts CR1 to CR4. The first to the fourth ribs 21L to 24L are adapted to fit with the first to the fourth grooves 11U to 14U provided on the supporting substrate 1, respectively. That is, because the first to the fourth ribs 21L to 24L do not exist at the first to the fourth corner parts CR1 to CR4, it is possible to easily attach the frame structure 2 to the supporting substrate 1 even if a material constituting the frame part 20 is a highly rigid material having less elasticity, for example. Further, the supporting substrate 1 is stably held by the frame structure 2 without using a bonding member, an adhesive, or the like. Accordingly, it is possible to reduce the number of components structuring the display apparatus 100, and to simplify an assembly operation of the display apparatus 100. Further, it is advantageous to reduce the thickness.

In addition, in the display apparatus 100, further providing the light shielding part 25 so as to cover the first to the fourth corner parts CR1 to CR4 makes it possible for the frame structure 2 to avoid a leakage of light, for example, from the rear, that is, from the rear surface side of the display apparatus 100 to the display panel 3 through a gap between the supporting substrate 1 and the frame structure 2. As a result, it is possible for the display apparatus 100 to suppress a degradation of image quality of a display image to be displayed on the display surface 3A.

Further, as illustrated in FIG. 4E, because the third rib 23L has the edge 23LL having the concavo-convex shape, it is possible to insert the third rib 23L into the third groove 13U in a stepwise manner in the X-axis direction. Accordingly, it is possible to perform an operation of attaching the frame structure 2 to the supporting substrate 1 easily and efficiently.

2. Other Modification Examples

While the present disclosure has been described with reference to the above embodiments, the present disclosure is not limited to the above embodiments, and various modifications can be made. For example, a shape, a size, and the like of each of the supporting substrate 1, the frame structure 2, and the display panel 3 described in the above embodiment are exemplary, and are not limited thereto.

Further, in the present technology, instead of the supporting substrate 1 and the frame structure 2 in the above embodiment, it is possible to employ, for example, a supporting substrate 1A and a frame structure 2A according to a first modification example illustrated in FIG. 13. FIG. 13 illustrates a cross section taken along the thickness direction of the supporting substrate 1A and the frame structure 2A according to the first modification example. Specifically, in the supporting substrate 1A, the first end face part 11 further includes a first reference surface 11A and a first recessed surface 11B recessed inwardly than the first reference surface 11A. It is preferable that the second to the fourth end face parts 12 to 14 of the supporting substrate 1A have a configuration similar to that of the first end face part 11 described above. Meanwhile, the frame structure 2A further includes a first step part 21S that is in contact with the first recessed surface 11B and extends along the first rib 21L. It is preferable that the frame structure 2A further include second to fourth step parts extending along the second to the fourth ribs 22L to 24L as well.

In the first modification example of FIG. 13, for example, even in a case where a through hole is formed on the first rib 21L upon forming the part 16 at a peripheral part of the supporting substrate 1A, it is possible to prevent light from escaping toward the display panel 3 side from a gap between the first end face part 11 and the supporting substrate 1A. This is because light is shielded at the first step part 21S. However, if the first step part 21S does not exist, in a case where the through hole is erroneously formed on the first rib 21L as illustrated in FIG. 14, there is a possibility that the light may escape toward the display panel 3 side from the gap between the first end face part 11 and the supporting substrate 1.

Further, for example, the display apparatus described in the above embodiment is not limited to a case where the display apparatus includes all the described components, and may lack some of the components or may further include any other component.

In addition, the display apparatus 100 described in the above embodiments and the like is not limited to a television used in a home, and includes broadly a display apparatus that displays information both indoors and outdoors. Furthermore, the display apparatus 100 described in the above embodiments and the like has applicability to a variety of medical devices (such as an endoscopic surgery system, an operating room system, or a microscopic surgery system).

In the display apparatus according to one embodiment of the present disclosure, the first rib and the second rib respectively erected on the first part and the second part that are other than the first corner part of the cyclic frame part are adapted to fit respectively with the first groove and the second groove provided on the substrate. Thus, the substrate is stably held in the frame structure without using a bonding member, an adhesive, or the like. In addition, because the first rib and the second rib are not provided in the first corner part, it is possible to easily attach the frame structure to substrate even if a constituent material of the frame part is a highly rigid material having less elasticity.

According to the display apparatus 100 as one embodiment of the present disclosure, because the frame structure having the cyclic frame part is employed, it is possible to prevent a deformation due to self-weight or the like resulting from an increase in screen size and a decrease in thickness, while having a simple configuration. Accordingly, it is possible to achieve a structure suitable for increasing the screen size and decreasing the thickness while securing an appropriate strength.

It is to be noted that effects of the present disclosure are not limited thereto, and may be any of the effects described below. Moreover, the present technology can be configured as follows.

(1)
A display apparatus including:
a display panel having a display surface and a rear surface;
a substrate that faces the rear surface of the display panel, and having an outer circumference end face, a first groove, and a second groove, the outer circumference end face including a first end face part extending in a first direction and a second end face part extending in a second direction and intersecting the first end face part at a first intersection, the first groove being formed on the first end face part and extending in the first direction, the second groove being formed on the second end face part and extending in the second direction; and
a frame structure that holds the display panel and the substrate, and having a frame part, a first rib, and a second rib, the frame part having a cyclic shape, extending along the outer circumference end face, and surrounding the substrate and the display panel, the first rib being erected on a first part, of the frame part, that is other than a first corner part corresponding to the first intersection and being fitted with the first groove, the second rib being erected on a second part, of the frame part, that is other than the first corner part corresponding to the first intersection and being fitted with the second groove.

(2)
The display apparatus according to (1), in which the frame structure further includes a light shielding part that is disposed at the frame part and covers the first corner part.

(3)
The display apparatus according to (1) or (2), in which
the first end face part further includes a first reference surface and a first recessed surface recessed inwardly than the first reference surface,
the second end face part further includes a second reference surface and a second recessed surface recessed inwardly than the second reference surface, and
the frame structure further includes a first step part that is in contact with the first recessed surface and extends along the first rib, and a second step part that is in contact with the second recessed surface and extends along the second rib.

(4)
The display apparatus according to any one of (1) to (3), in which
the substrate has a substantially rectangular planar shape extending in both the first direction and the second direction,
the outer circumference end face further includes
a third end face part provided at a position that faces the first end face part and intersecting the second end face part at a second intersection, and
a fourth end face part provided at a position that faces the second end face part and intersecting the third end face part at a third intersection and intersecting the first end face part at a fourth intersection,
the substrate further has
a third groove formed on the third end face part and extending in the first direction, and
a fourth groove formed on the fourth end face part and extending in the second direction,
the frame structure includes
a third rib erected on a third part, of the frame part, that is other than a second corner part corresponding to the second intersection and that is other than a third corner part corresponding to the third intersection, and fitted with the third groove, and
a fourth rib erected on a fourth part, of the frame part, that is other than the third corner part and that is other than a fourth corner part corresponding to the fourth intersection, and fitted with the fourth groove, and
the second part is a part, of the frame part, that is other than the fourth corner part.

(5)
The display apparatus according to (4), in which the third rib has a concavo-convex shape in which a size that is parallel to the display surface and that is in a direction orthogonal to the third end face part varies cyclically in the first direction.

The present application claims the benefit of Japanese Priority Patent Application JP2018-244839 filed with the Japan Patent Office on Dec. 27, 2018, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A display apparatus comprising:
   a display panel having a display surface and a rear surface, the display panel comprising a plurality of pixels;
   a substrate that faces the rear surface of the display panel, and having an outer circumference end face, a first groove, and a second groove, the outer circumference end face including a first end face part extending in a first direction and a second end face part extending in a second direction and intersecting the first end face part at a first intersection, the first groove being formed on the first end face part and extending in the first direction, the second groove being formed on the second end face part and extending in the second direction; and
   a frame structure that holds the display panel and the substrate, and having a frame part, a first rib, and a second rib, the frame part having a rectangular shape, extending along the outer circumference end face, and surrounding the substrate and the display panel, the first rib being erected on a first part, of the frame part, that is other than a first corner part corresponding to the first intersection and being fitted with the first groove, the second rib being erected on a second part, of the frame part.

2. The display apparatus according to claim 1, wherein the frame structure further includes a light shielding part that is disposed at the frame part and covers the first corner part.

3. The display apparatus according to claim 1, wherein the first end face part further includes a first reference surface and a first recessed surface recessed inwardly than the first reference surface.

4. The display apparatus according to claim 3, wherein the second end face part further includes a second reference surface and a second recessed surface recessed inwardly than the second reference surface.

5. The display apparatus according to claim 4, wherein the frame structure further includes a first step part that is in contact with the first recessed surface.

6. The display apparatus according to claim 5, wherein the frame structure extends along the first rib.

7. The display apparatus according to claim 6, wherein the frame structure comprises a second step part that is in contact with the second recessed surface and extends along the second rib.

8. The display apparatus according to claim 1, wherein the substrate has a substantially rectangular planar shape extending in both the first direction and the second direction.

9. The display apparatus according to claim 8, wherein the outer circumference end face further includes a third end face part provided at a position that faces the first end face part and intersecting the second end face part at a second intersection.

10. The display apparatus according to claim 9 wherein the outer circumference end face comprises a fourth end face part provided at a position that faces the second end face part that intersects the third end face part at a third intersection.

11. The display apparatus according to claim 10, wherein the third intersection intersects the first end face part at a fourth intersection.

12. The display apparatus according to claim 11, wherein the substrate further has a third groove formed on the third end face part and extending in the first direction.

13. The display apparatus according to claim 12, wherein the substrate further comprises a fourth groove formed on the fourth end face part and extending in the second direction.

14. The display apparatus according to claim 13, wherein the frame structure includes a third rib erected on a third part, of the frame part, that is other than a second corner part corresponding to the second intersection and that is other than a third corner part corresponding to the third intersection, and fitted with the third groove.

15. The display apparatus according to claim 14, wherein the frame structure comprises fourth rib erected on a fourth part, of the frame part, that is other than the third corner part and that is other than a fourth corner part corresponding to the fourth intersection, and fitted with the fourth groove.

16. The display apparatus according to claim 15, wherein
   the second part is a part, of the frame part, that is other than the fourth corner part, and
   the third rib has a concavo-convex shape in which a size that is parallel to the display surface and that is in a direction orthogonal to the third end face part varies cyclically in the first direction.

17. The display apparatus according to claim 1, wherein the first and second parts are caulking holes.

18. A display apparatus comprising:
   a display panel having a display surface and a rear surface, the display panel comprising a plurality of pixels; and
   a frame structure that holds the display panel, and having a frame part, a first rib, and a second rib, the frame part having a rectangular shape, extending along an outer circumference end face of a substrate, and surrounding the substrate and the display panel, the first rib being erected on a first part, of the frame part, that is other than a first corner part corresponding to a first intersection of the substrate and being fitted with a first groove, the second rib being erected on a second part, of the frame part.

19. The display apparatus of claim 18, wherein the substrate faces the rear surface of the display panel, and includes the outer circumference end face, the first groove, and a second groove, the outer circumference end face including a first end face part extending in a first direction and a second end face part extending in a second direction and intersecting the first end face part at the first intersection, the first groove being formed on the first end face part and extending in the first direction, the second groove being formed on the second end face part and extending in the second direction.

20. A display apparatus comprising:
   a display panel having a display surface and a rear surface, the display panel comprising a plurality of pixels;
   a substrate that faces the rear surface of the display panel, and having an outer circumference end face, a first groove, and a second groove, the outer circumference end face including a first end face part extending in a first direction and a second end face part extending in a second direction and intersecting the first end face part at a first intersection, the first groove being formed on the first end face part and extending in the first direction, the second groove being formed on the second end face part and extending in the second direction; and
   a frame structure that holds the substrate, and having a first rib, and a second rib, the first rib being erected on a first part, of the frame part, that is other than a first corner part corresponding to the first intersection and being fitted with the first groove, the second rib being erected on a second part, of the frame part.

* * * * *